United States Patent
Fitzmorris et al.

(10) Patent No.: US 10,421,904 B2
(45) Date of Patent: Sep. 24, 2019

(54) SEMICONDUCTOR STRUCTURE AND LIGHT-EMITTING DEVICE WITH SEMICONDUCTOR STRUCTURES

(71) Applicant: OSRAM Opto Semiconductors GmbH, Regensburg (DE)

(72) Inventors: Bob Fitzmorris, Portland, OR (US); Joseph Treadway, Portland, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/809,941

(22) Filed: Nov. 10, 2017

(65) Prior Publication Data

US 2019/0144746 A1 May 16, 2019

(51) Int. Cl.
C09K 11/88 (2006.01)
H01L 33/50 (2010.01)
B82Y 20/00 (2011.01)

(52) U.S. Cl.
CPC .......... C09K 11/883 (2013.01); H01L 33/504 (2013.01); H01L 33/505 (2013.01); H01L 33/507 (2013.01); *B82Y 20/00* (2013.01); *Y10S 977/774* (2013.01); *Y10S 977/824* (2013.01); *Y10S 977/95* (2013.01)

(58) Field of Classification Search
CPC ................. H01L 33/502; H01L 33/501; H01L 2933/0041; C09K 11/025
See application file for complete search history.

(56) References Cited

U.S. PATENT DOCUMENTS

| | | | |
|---|---|---|---|
| 9,153,734 B2 | 10/2015 | Kurtin et al. | |
| 9,159,872 B2 | 10/2015 | Kurtin et al. | |
| 9,368,693 B2 | 6/2016 | Kurtin | |
| 9,732,274 B2 | 8/2017 | Mangum et al. | |
| 9,793,446 B2 * | 10/2017 | Kurtin | C01B 19/007 |
| 10,106,734 B2 * | 10/2018 | Ghosh | C09K 11/025 |
| 2017/0029697 A1 * | 2/2017 | Ghosh | C09K 11/883 |

OTHER PUBLICATIONS

Chin, P.T.K. et al., "Highly Luminescent CdTe/CdSe Colloidal Heteronanocrystals with Temperature-Dependent Emission Color," Journal of the American Chemical Society, vol. 129, No. 48, Oct. 11, 2007, 7 pages.

McBride, J. et al., "Structural Basis for Near Unity Quantum Yield Core/Shell Nanostructures," Nano Letters, vol. 6, No. 7, Jun. 9, 2006, 6 pages.

* cited by examiner

*Primary Examiner* — Dung A. Le
(74) *Attorney, Agent, or Firm* — Slater Matsil, LLP

(57) ABSTRACT

A semiconductor structure and a light-emitting device having a light-emitting diode and a plurality of semiconductor structures are disclosed. In an embodiment, the semiconductor structure includes an elongated seed particle including a first semiconductor material, wherein the seed particle has an aspect ratio of greater than 2.0, and wherein the semiconductor structure is part of or forms a quantum dot.

18 Claims, 6 Drawing Sheets

SEMICONDUCTOR STRUCTURE AND LIGHT-EMITTING DEVICE WITH SEMICONDUCTOR STRUCTURES

TECHNICAL FIELD

Embodiments of the present invention are related to semiconductor structures, in particular to semiconductor structures forming quantum dots, as well as light-emitting devices which comprise such semiconductor structures.

BACKGROUND

Semiconductor nanoparticles that can be prepared so as to luminesce in a particle-size-dependent fashion when irradiated with suitable incident light are commonly known as quantum dots. Usually, as the temperature of the nanoparticles is increased, there is a change in the quantum yield for light emission and there may be also a change in the energy and shape of the emission band. The quantum yield can also change depending on the flux of incident light. In particular, quantum dots used in today's applications usually exhibit a pronounced thermal and flux droop, i.e., a significant decrease of the photoluminescence quantum yield with increasing temperatures and with increasing incident light intensities.

It is also known that the particle morphology contributes to the emission properties, but so far this contribution has usually been understood with respect to the relative ease and completeness of epitaxially overcoating emissive seeds with larger bandgap related semiconductors. For example, the poor luminescence performance of tetrapod-shaped nanoparticles has been attributed to the difficulty in perfectly applying a non-interrupted continuous epitaxial layer of inorganic material, rather than to an intrinsic attribute of tetrapod-shaped nanoparticles.

SUMMARY

Embodiments of the invention specify a semiconductor structure. Further embodiments specify a light-emitting device with semiconductor structures.

In accordance with at least one embodiment, a semiconductor structure comprises a first semiconductor material, wherein the semiconductor structure is part of or forms a quantum dot.

According to a further embodiment, the seed particle has an elongated shape. In other words, the semiconductor structure can have an elongated seed particle. "Elongated" can in particular mean that along one direction the seed particle has a maximum extension, while in all other directions the seed particle has extensions which are smaller than the maximum extension. In particular, the seed particle has a length, which can be the dimension of the seed particle along a first direction with the maximum extension. In a direction perpendicular to the length, the seed particle can have a width. In particular, the width can denote the maximum extension of the seed particle along a second direction, which is perpendicular to the first direction. The ratio of the length to the width can be denoted as aspect ratio of the seed particle.

According to a further embodiment, the seed particle has an aspect ratio of greater than 1.5. Preferably, the seed particle can have an aspect ratio of at least 2.0 or, even more preferably, of at least 3.0. Furthermore, the seed particle can have an aspect ratio between and including 2.0 and 4.0, or an aspect ratio between and including 3.0 and 4.0.

According to a further embodiment, the seed particle has a length between and including 2 nm and 10 nm.

According to a further embodiment, the semiconductor structure further comprises a shell having at least one layer comprising a second semiconductor material, wherein the shell completely encloses the seed particle. In particular, the first and second semiconductor materials can be different from each other. The second semiconductor material can have a bandgap that is larger than the bandgap of the first semiconductor material. Furthermore, the shell can comprise one or more layers, wherein in the latter case at least two of the more than one layers comprise different materials or blends of different materials. Moreover, the semiconductor structure comprises a plurality of seed particles, wherein the plurality of seed particles is enclosed by at least one layer of the shell. Additionally, each of the plurality of the seed particles can individually be surrounded by one or more layers of the shell.

According to a further embodiment, the seed particle is arranged off-center inside the shell. This can, in particular, mean that the seed particle has a seed center and the shell has a shell center, wherein the seed center and the shell center do not coincide and therefore are non-coinciding. Alternatively, the seed particle can be arranged centered in the shell, meaning that the seed center and the shell center coincide. The center of the seed particle and/or the center of the shell can be a geometrical center or a center of gravity, respectively.

According to a further embodiment, the shell has a shape that is different from the shape of the seed particle. This can mean, for example, that the shell is not elongated but has an outer shape which resembles for instance the shape of a sphere. Furthermore, the shell can also be elongated but can have an aspect ratio different from the aspect ratio of the seed particle.

In accordance with another embodiment, a semiconductor structure comprises an elongated seed particle comprising a first semiconductor material, wherein the semiconductor structure is part of or forms a quantum dot, wherein the semiconductor structure, in particular the seed particle, produces photoluminescence emission when being irradiated with an excitation light, and wherein the semiconductor structure has a photoluminescence quantum yield of at least 65% at any temperature in a temperature range between and including 20° C. and 150° C. and at an excitation light having a flux of approximately 10 W/cm².

In accordance with another embodiment, a semiconductor structure comprises an elongated seed particle comprising a first semiconductor material, wherein the semiconductor structure is part of or forms a quantum dot, wherein the semiconductor structure, in particular the seed particle, produces photoluminescence emission when being irradiated with excitation light, and wherein the semiconductor structure has a photoluminescence quantum yield of at least 60% at a temperature of 105° C. and at an excitation light having a flux of more than 0 W/cm² and equal to or less than 150 W/cm².

In accordance with another embodiment, a semiconductor structure comprises an elongated seed particle comprising a first semiconductor material, wherein the semiconductor structure is part of or forms a quantum dot, wherein the semiconductor structure, in particular the seed particle, produces photoluminescence emission when being irradiated with excitation light, wherein the semiconductor structure has a photoluminescence quantum yield of at least 65% at any temperature in a temperature range between and including 20° C. and 150° C. and at an excitation light having a flux of approximately 10 W/cm² and wherein the semiconductor structure has a photoluminescence quantum yield of at least 60% at a temperature of 105° C. and at an excitation light having a flux of more that 0 W/cm² and equal to or less than 150 W/cm².

According to a further embodiment, the semiconductor structure has a photoluminescence quantum yield deviation of less than 20% at any temperature in a temperature range between and including 20° C. and 150° C. and at an excitation light having a flux of 10 W/cm². Having a photoluminescence quantum yield deviation of less than 20% at any temperature in said temperature range can in particular mean that the photoluminescence quantum yield has a global maximum at a first temperature in said temperature range and a global minimum at a second temperature in said temperature range, wherein the difference between the global maximum and the global minimum is less than 20%. Furthermore, the semiconductor structure can have a photoluminescence quantum yield deviation of less than 10% at any temperature in a temperature range between and including 20° C. and 150° C. and at an excitation light having a flux of 10 W/cm².

In accordance with another embodiment, a light-emitting device has a light-emitting diode and a plurality of semiconductor structures, each of the semiconductor structures having an elongated seed particle comprising a first semiconductor material, the seed particle having an aspect ratio of greater than 1.5, and each of the semiconductor structures being part of or forming a quantum dot. All features described in connection with the semiconductor structure apply also to the light-emitting device and vice-versa.

BRIEF DESCRIPTION OF THE DRAWINGS

Further features, advantages and expediencies will become apparent from the following description of exemplary embodiments in conjunction with the figures.

In the figures, elements of the same design and/or function are identified by the same reference numerals. It is to be understood that the embodiments shown in the figures are illustrative representations and are not necessarily drawn to scale.

DETAILED DESCRIPTION OF ILLUSTRATIVE EMBODIMENTS

In the following, specific details are set forth, such as specific features and advantageous effects of semiconductor structures and a light-emitting device with semiconductor structures, in order to provide a thorough understanding of embodiments of the invention. It will be apparent to one skilled in the art that embodiments of the invention may be practiced without these specific details. In other instances, well-known related apparatuses, such as the host of varieties of applicable light emitting diodes, are not described in detail in order to not unnecessarily obscure embodiments of the invention.

Figure 1:
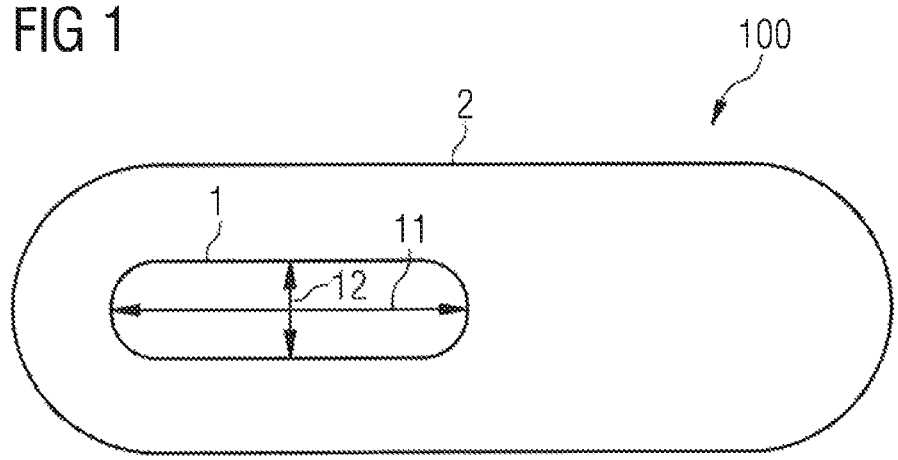
FIG. 1 shows a schematic illustration of a semiconductor structure according to a preferred embodiment.

FIG. 1 shows a schematic illustration of a semiconductor structure 100 according to a preferred embodiment. The semiconductor structure 100 is part of or forms a quantum dot and comprises a seed particle 1 having a first semiconductor material.

The semiconductor structure 100 and, in particular, the seed particle 1, can be prepared so as to luminesce in a particle-size-dependent fashion. In order to obtain a practically usable quantum efficiency of the photoluminescent emission, it is preferred to add a shell 2 comprising at least one inorganic coating of a larger band-gap material and/or a passivating layer such as an organic polymer or metal oxide/semiconductor such as silica ($SiO_x$), titanium oxide ($TiO_x$), zirconium oxide ($ZrO_x$), alumina ($AlO_x$), magnesium oxide ($MgO_x$) and hafnia ($HfO_x$).

In a particularly preferred embodiment, the semiconductor structure 100 further has a shell 2 which comprises, as depicted in FIG. 1, at least one layer having a second semiconductor material. The shell 2 preferably completely encloses the seed particle 1.

The seed particle 1 has an elongated shape with a length 11, which is the maximum extension of the seed particle 1. The length 11 is oriented along a first direction, while in all other directions different from the first direction the seed particle 1 has extensions which are smaller than the length 11. In a direction perpendicular to the length 11, the seed particle 1 has a width 12. In particular, the width 12 can denote the maximum extension of the seed particle 1 along a second direction which is perpendicular to the first direction. In a preferred embodiment, the seed particle 1 has a length 11 between and including 2 nm and 10 nm.

The aspect ratio of the seed particle 1, which is the ratio of the length 11 to the width 12, can be greater than 1.5. In a preferred embodiment, the seed particle 1 has an aspect ratio of at least 2.0 or, even more preferably, of at least 3.0. It has been found that it can be particularly advantageous if the seed particle 1 has an aspect ratio between and including 2.0 and 4.0 or even between and including 3.0 and 4.0. As explained in more detail below, the shell can be virtually of any shape and size that are suitable for obtaining desired emission parameters.

The first and second semiconductor materials, i.e., the seed particle 1 and the shell 2 or at least one layer of the shell 2, are each materials such as, but not limited to, Group II-VI materials, Group III-V materials, Group IV-VI materials, Group I-III-VI materials, or Group II-IV-VI materials and, in one embodiment, are mono-crystalline. In particular, the first and second semiconductor materials are different from each other.

In a preferred embodiment, the first and second semiconductor materials can be both Group II-VI materials. In a further preferred embodiment, the first semiconductor material, for example, comprises or is cadmium selenide (CdSe), whereas the second semiconductor material comprises or is one such as, but not limited to, cadmium sulfide (CdS), zinc sulfide (ZnS), or zinc selenide (ZnSe).

There are various synthetic approaches for fabricating semiconductor structures, for example, with CdSe seed particles. For instance, in an embodiment, under an inert atmosphere (e.g., ultra high purity (UHP) argon), cadmium oxide (CdO) is dissociated in the presence of surfactant (e.g., octadecylphosphonic acid (ODPA)) and solvent (e.g., trioctylphosphine oxide (TOPO); trioctylphosphine (TOP)) at high temperatures (e.g., 350° C. to 380° C.). Resulting $Cd^{2+}$ cations are exposed by rapid injection to solvated selenium anions ($Se^{2-}$), resulting in a nucleation event forming small CdSe seeds. The seeds continue to grow, feeding off of the remaining $Cd^{2+}$ and Se— available in solution, with the resulting seed particles being stabilized by surface interactions with the surfactant in solution (ODPA). The aspect ratio of the CdSe seed particles is strongly influenced by the ratio of the ODPA to the Cd concentration in solution, as well as other factors such as reaction temperature. The quality and final size of these seed particles is affected by several variables such as, but not limited to, reaction time, temperature, reagent concentration, surfactant concentration, moisture content in the reaction, or mixing rate.

For growing a shell on the CdSe seed particles, the shell comprising, for example, cadmium sulfide (CdS), under an inert atmosphere (e.g., UHP argon), cadmium oxide (CdO) is dissociated in the presence of surfactants (e.g., ODPA and hexylphosphonic acid (HPA)) and solvent (e.g., TOPO and/or TOP) at high temperatures (e.g., 350° C. to 380° C.). The resulting $Cd^{2+}$ cations in solution are exposed by rapid injection to solvated sulfur anions ($S^{2-}$) and CdSe seed particles. Immediate growth of the CdS shell around the CdSe seed particles occurs. The use of both a short chain and long chain phosphonic acids can, for example, promote an enhanced growth rate in a direction along the length axis of the seed particles, and a slower growth along the directions perpendicular to the length axis of the seed particles, resulting in a rod-shaped semiconductor structure as shown as an exemplary embodiment in FIG. 1.

Figure 2A:
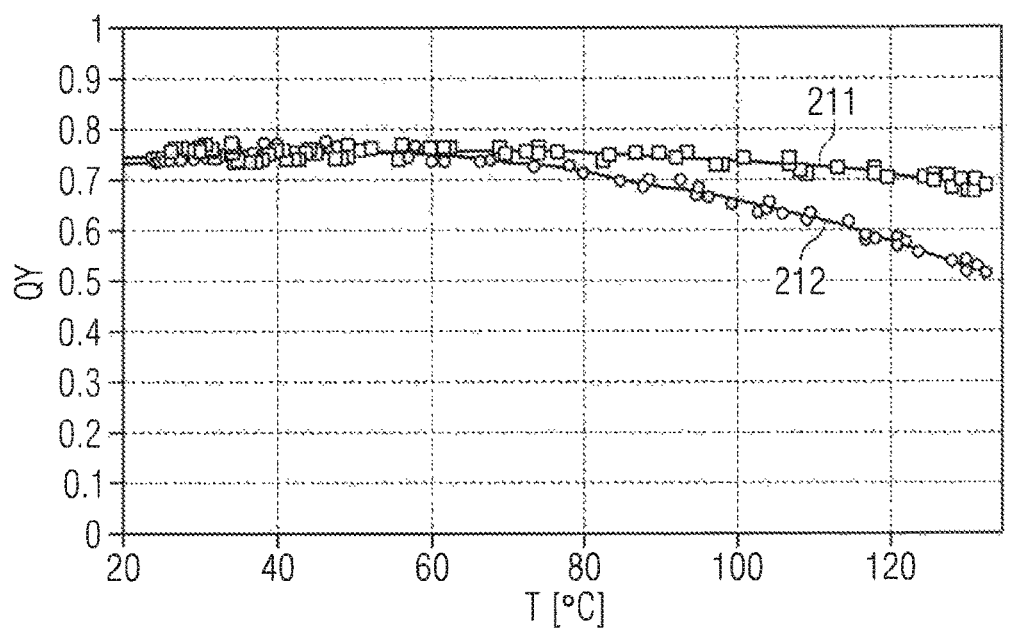
FIGS. 2A and 2B show quantum yield diagrams of an embodiment of semiconductor structures and of a comparative sample.
Figure 2B:
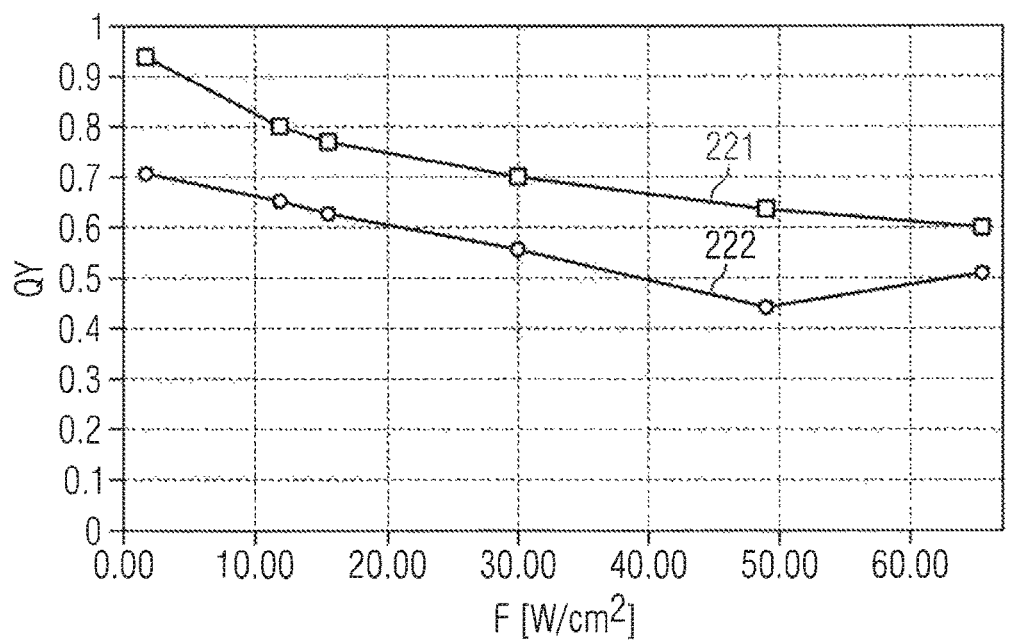

FIGS. 2A and 2B show quantum yield diagrams of an embodiment of semiconductor structures with CdSe seed particles in comparison with a conventional sample of core-shell type quantum dots with CdSe cores. The semiconductor structures as well as the conventional quantum dots had similar shells and both were dispensed in a respective matrix material formed from a silicone film. The seed particles of the semiconductor structures according to the embodiment were sized via transmission electron microscopy (TEM) at an average of about 8.09 nm in length and of about 4.16 nm in width, resulting in an aspect ratio of about 2(+/−0.3) (309 particles counted). The cores of the conventional quantum dots were also sized via TEM at an average of about 5.58 nm in length and of about 4.22 nm in width, resulting in an aspect ratio of about 1.3(+/−0.17) (2145 particles counted). As excitation light the light of a blue laser was used.

FIG. 2A shows the photoluminescence quantum yield (QY) depending on the sample temperature (T). The measurements were conducted at an intensity of approximately 10 W/cm². The measurement with the semiconductor structures of the embodiment is represented by graph 211, while the measurement with the conventional quantum dots is represented by graph 212.

It is immediately apparent that the conventional quantum dots and the semiconductor structures of the embodiment both result in core-shell nanoparticles with very similar quantum yields at room temperature. However, at higher temperatures, in particular at temperatures above 70° C., the two graphs diverge. In the case of the conventional quantum dots the bowing in the temperature dependence curve indicates a typical decrease of the quantum yield with increasing temperature, while the relatively flat dependence with temperature in the measurement of the semiconductor structures of the embodiment is both exceptional and surprising. In particular, the semiconductor structures have a photoluminescence quantum yield of at least 65% at any temperature in a temperature range between and including 20° C. and 150° C. and at an excitation light having a flux of approximately 10 W/cm². Moreover, the semiconductor structures have a photoluminescence quantum yield deviation of less than 20% and even of less than 10% at any temperature in a temperature range between and including 20° C. and 150° C. and at an excitation light having a flux of 10 W/cm².

Fixing the temperature at 105° C. and measuring the photoluminescence quantum yield as a function of the flux F of the excitation light for the conventional sample as well as for the semiconductor structures of the embodiment provided the results shown in FIG. 2B, indicated by graph 221 for the semiconductor structures and by graph 222 for the conventional quantum dots. Once again, the comparison is dramatic and consistent. In particular, the semiconductor structures of the embodiment have a photoluminescence quantum yield of at least 60% at a temperature of 105° C. and at an excitation light having a flux of more that 0 W/cm² and equal to or less than about 60 W/cm². Moreover, the quantum yield of the semiconductor structures is relatively 20% to 37% higher compared to the quantum yield of the conventional sample.

Figure 3A:
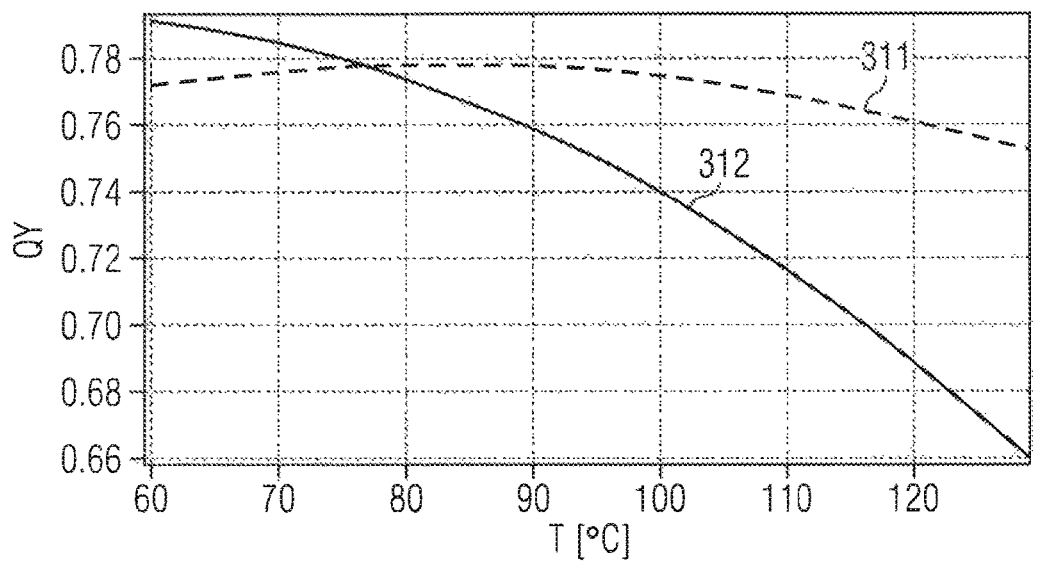
FIGS. 3A and 3B show quantum yield diagrams of another embodiment of semiconductor structures and of a comparative sample.
Figure 3B:
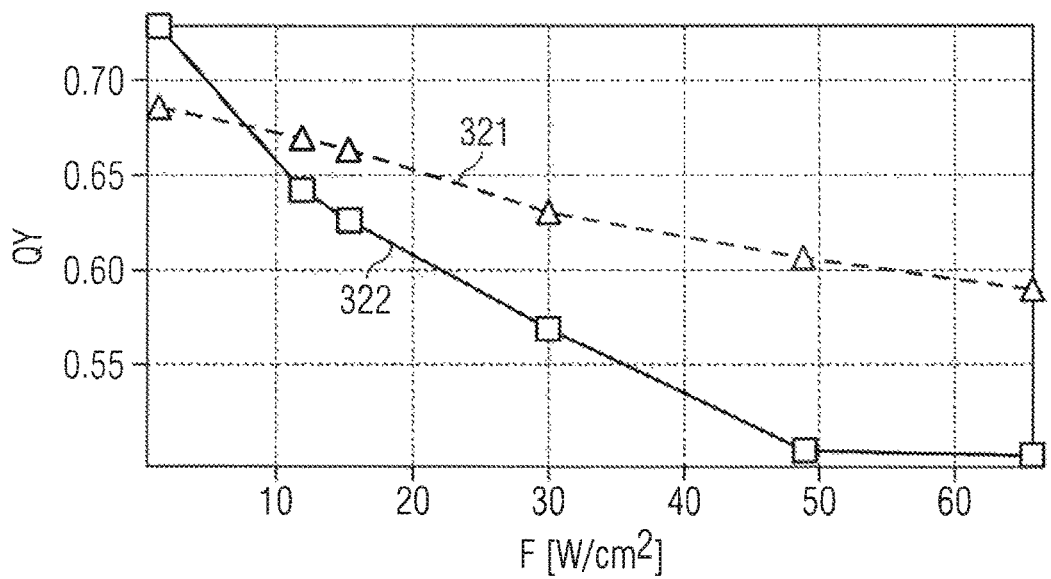

FIGS. 3A and 3B show quantum yield diagrams similar to those of FIGS. 2A and 2B, but for another embodiment of semiconductor structures with an aspect ratio of about 3. The graphs 311 and 321 correspond to the graphs 211 and 221 as explained in connection with FIGS. 2A and 2B, while the graphs 312 and 322 correspond to the graphs 212 and 222. The deviation of the graphs 312 and 322 from graphs 212 and 222 lies in the fact that for the measurements represented by FIGS. 3A and 3B a different sample of conventional quantum dots with cores with an aspect ratio below 1.5 was used in comparison to the measurements represented by FIGS. 2A and 2B. However, the results of the semiconductor structures used for the measurements represented by FIGS. 3A and 3B are comparable to and consistent with the results explained in connection with FIGS. 2A and 2B.

As can be seen from FIGS. 2A to 3B, the use of elongated seed nanoparticles as described herein with aspect ratios greater than 1.5 and preferably of at least 2.0 or even of at least 3.0 afford a superior temperature-dependent emission behavior compared to comparable quantum dots with rather spheroidal cores, even when comparable epitaxial shell layers have been applied to both seed types. Thus, according to the embodiments described herein, it is possible to prepare more efficiently emissive particles in particular with rising temperatures. This approach may result in semiconductor structures which display superior resilience to luminescence quenching even at very high optical fluxes in combination with high temperatures—conditions such as those encountered in quantum dot down-converting light-emitting diode configurations.

FIGS. 4A to 4H show further various exemplary embodiments of the semiconductor structure 100, which exhibit the advantages described before.

Each of the semiconductor structures 100 depicted in FIGS. 4A to 4F comprises a seed particle 1 according to one of the embodiments described before and a shell 2 having an inner layer 21 and an outer layer 22, the inner layer 21 completely surrounding and enclosing the seed particle 1, and the outer layer 22 partly or completely surrounding and enclosing the inner layer 21. The seed particle 1 comprises a first semiconductor material. The inner layer 21 of the shell 2 comprises a second semiconductor material, and the outer layer 22 of the shell 2 comprises a third semiconductor material. As described before, the first and second semiconductor materials can, for example, be both Group II-VI materials and preferably are different from each other. The first semiconductor material, for example, comprises or is cadmium selenide (CdSe) and the second semiconductor material comprises or is one such as, but not limited to, cadmium sulfide (CdS), zinc sulfide (ZnS), or zinc selenide (ZnSe). The third semiconductor material can be a material as described for the second semiconductor material and can preferably be different from the first and second semiconductor materials. In a particularly preferred embodiment, the first semiconductor material comprises or is cadmium selenide (CdSe), the second semiconductor material comprises or is cadmium sulfide (CdS), and the third semiconductor material comprises or is zinc sulfide (ZnS).

Figure 4A:
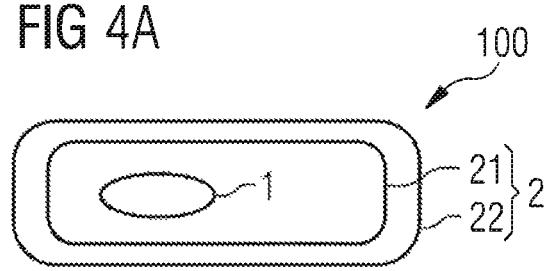
FIGS. 4A to 4H show schematic illustrations of semiconductor structures according to further embodiments.
Figure 4B:
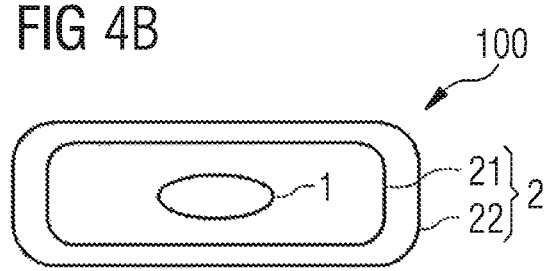

As illustrated in FIG. 4A as well as before in FIG. 1, the seed particle 1 can be arranged off-center inside the shell 2, meaning that the seed center and the shell center are non-coinciding. The center of the seed particle 1 and the center of the shell 2 can be geometrical centers or centers of gravity. Alternatively, as shown in FIG. 4B, the seed particle 1 can be arranged centered in the shell 2, meaning that the seed center and the shell center coincide.

Figure 4C:
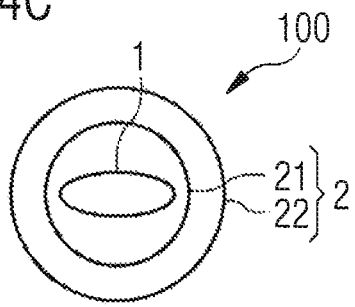

Furthermore, the shell 2 can have a shape that is different from the shape of the seed particle 1. This can mean, for example, that the shell 2 resembles another outer shape than the outer shape of the seed particle 1, while both the seed particle 1 and the shell 2 can be elongated, as, for example, shown in FIGS. 1, 4A, 4B and 4D to 4F. In particular, the shell 2 can also be elongated but can have an aspect ratio different from the aspect ratio of the seed particle 1. Alternatively, the shell 2 can be not elongated but can have an outer shape which resembles for instance the shape of a sphere, as shown in FIG. 4C.

Figure 4D:
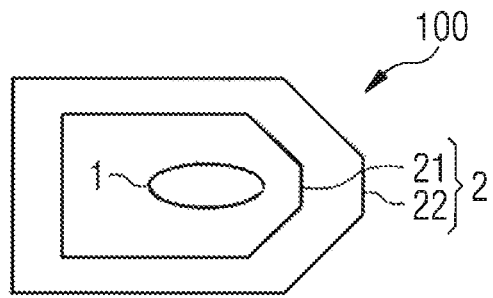
Figure 4E:
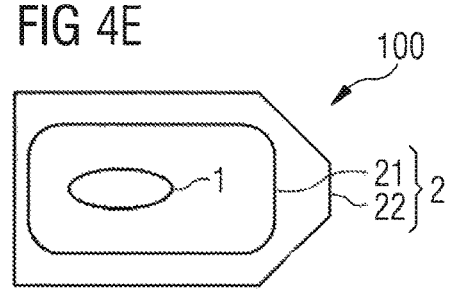
Figure 4F:
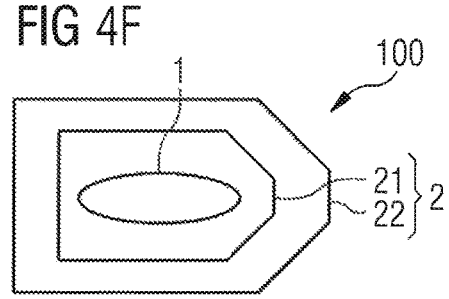

Moreover, the shell can be of a symmetrical shape as shown in FIGS. 1, 4A, 4B and 4C, or can have an asymmetrical shape with respect to at least one symmetry plane, as illustrated in FIGS. 4D, 4E and 4F. In these cases, the seed particle 1 can be off-center, as shown in FIGS. 4D and 4E, or can have a seed center coinciding with the shell center, as shown in FIG. 4F.

Figure 4G:
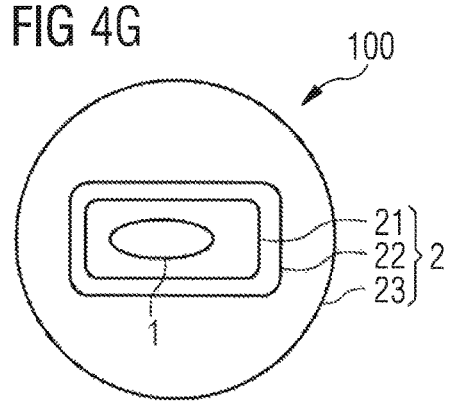
Figure 4H:
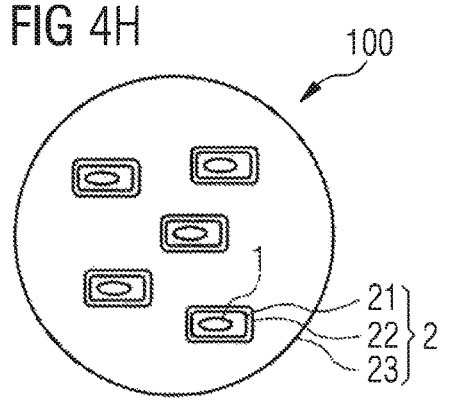

FIGS. 4G and 4H show semiconductor structures 100 with a seed particle 1 and shell layers 21, 22, which are embodied by way of example like the seed particle 1 and the shell layers 21, 22 of the embodiment shown in FIG. 4A. However, the semiconductor structures 100 of FIGS. 4G and 4H have a shell 2 with a further outer layer 23 partly or completely surrounding and enclosing the layer 22. The outer layer 23 can preferably comprise or be formed of an insulating material such as an insulating metal oxide, for example, silica or alumina or another oxide as listed above in connection with FIG. 1.

As depicted in FIG. 4H, the semiconductor structure 100 can have a plurality of seed particles 1, wherein each of the seed particles 1 can individually be surrounded by one or more shell layers 21, 22 and wherein all seed particles 1 together are surrounded be at least one or more shell layer as the exemplary shown shell layer 23. For clarity reasons only one of the plurality of seed particles with individual shell layers is marked by reference numerals in FIG. 4H. The data in FIGS. 2A, 2B, 3A, and 3B were obtained using structures such as these.

It should be noted that FIGS. 4A to 4H depict several, but not all, examples of typical seed-shell configurations for the semiconductor structure according to the embodiments described herein. As mentioned before, while two or three shell layers are depicted, the shell can also have one to many layers. FIGS. 4A to 4H in particular illustrate that an exemplary variety of morphological differences are possible for each of the shell layers and that each layer does not have to be the same within a given plurality of semiconductor structures. Additionally, the number and/or position of the seed particle within the overall semiconductor structure can vary.

In an embodiment, the semiconductor structured described herein is part of or forms a quantum dot which is a down-converting quantum dot. However, in an alternative embodiment, the quantum dot is an up-shifting quantum dot. In either case, a light-emitting device may include a light-emitting diode and a plurality of semiconductor structures such as those described above. The semiconductor structures may be applied proximal to the light-emitting diode and provide down-conversion or up-shifting of light emitted from the light-emitting diode. Thus, semiconductor structures according to the invention may be advantageously used in solid state lighting. The visible spectrum includes light of different colors having wavelengths between about 380 nm and about 780 nm that are visible to the human eye. A light-emitting diode can emit a UV or blue light which is down-converted or up-shifted by semiconductor structures described herein. Any suitable ratio of color semiconductor structures may be used in devices of the invention. Light-emitting devices according to embodiments of the invention may have incorporated therein sufficient quantity of semiconductor structures described herein capable of down-converting any available blue light to red, green, yellow, orange, blue or other color.

Figure 5:
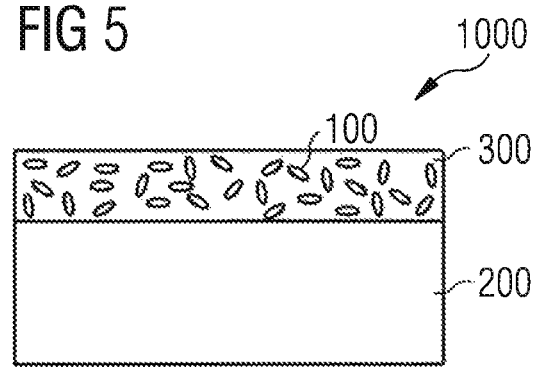
FIG. 5 shows a schematic illustration of a light-emitting device according to a further embodiment.

FIG. 5 illustrates an exemplary embodiment of a light-emitting device 1000 comprising a light-emitting diode 200 and a wavelength-conversion layer 300 having a matrix material with a dispersion of a plurality of semiconductor structures 100 therein, each of the semiconductor structures 100 having an elongated seed particle as described before. The light-emitting diode 200 can, for example, be a blue-emitting diode such as a light-emitting diode chip based on AlInGaN. The matrix material can comprise any organic or inorganic material that is suitable for a wavelength-conversion layer and that can be used as a matrix for the semiconductor structures 100. For instance, the matrix material can comprise a silicone or another transparent plastic material or a low-melting glass. Depending on their size and actual configuration, the semiconductor structures 100 can form quantum dots that emit light in a red to green wavelength region.

By way of example, the wavelength-conversion layer 300 is shown as a so-called chip-level conversion layer, which is directly applied onto the light-emitting diode 200. Alternatively, the wavelength-conversion layer 300 can also be formed remote from the light-emitting diode 200 or as a casting or mold material that at least partly covers the light-emitting diode 200.

Alternatively or additionally to the features described in connection with the figures, the embodiments shown in the figures can comprise further features described in the general part of the description. Moreover, features and embodiments of the figures can be combined with each other, even if such combination is not explicitly described.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

What is claimed is:

1. A semiconductor structure comprising:
   an elongated seed particle comprising a first semiconductor material,
   wherein the seed particle has an aspect ratio of greater than 2.0, and
   wherein the semiconductor structure is part of or forms a quantum dot;
   an inner shell comprising at least one layer having a second semiconductor material, wherein the inner shell completely encloses the seed particle; and
   an outer shell enclosing a plurality of the seed particles, wherein the outer shell comprises a first insulating material.

2. The semiconductor structure according to claim 1, wherein the seed particle has an aspect ratio of at least 3.0.

3. The semiconductor structure according to claim 1, wherein the seed particle has an aspect ratio greater than 2.0 and less than or equal to 4.0.

4. The semiconductor structure according to claim 1, wherein the first and second semiconductor materials are different from each other.

5. The semiconductor structure according to claim 1, wherein the seed particle is arranged off-center inside the inner shell.

6. The semiconductor structure according to claim 1, wherein the inner shell has a shape that is different from a shape of the seed particle.

7. The semiconductor structure according to claim 1, wherein the inner shell comprises at least one layer having a second insulating material.

8. The semiconductor structure according to claim 1, wherein the seed particle has a length between and including 2 nm and 10 nm.

9. A light-emitting device comprising:
   a light-emitting diode; and
   a plurality of semiconductor structures, each of the semiconductor structures comprising:
      an elongated seed particle comprising a first semiconductor material,
      wherein the seed particle has an aspect ratio of greater than 2.0, and
      wherein each of the semiconductor structures is part of or forms a quantum dot;
      an inner shell comprising at least one layer having a second semiconductor material,
      wherein the inner shell completely encloses the seed particle; and
      an outer shell enclosing a plurality of the seed particles, wherein the outer shell comprises a first insulating material.

10. A semiconductor structure comprising:
    an elongated seed particle comprising a first semiconductor material; and
    a shell comprising at least one layer including a second semiconductor material,
    wherein the seed particle has an aspect ratio of greater than 2.0,
    wherein the shell completely encloses the seed particle,
    wherein a plurality of seed particles is enclosed by at least one layer comprising a metal oxide, and
    wherein the semiconductor structure is part of or forms a quantum dot.

11. The light-emitting device according to claim 9, wherein the seed particle has an aspect ratio of at least 3.0.

12. The light-emitting device according to claim 9, wherein the seed particle has an aspect ratio greater than 2.0 and less than or equal to 4.0.

13. The light-emitting device according to claim 9, wherein the first and second semiconductor materials are different from each other.

14. The light-emitting device according to claim 9, wherein the seed particle is arranged off-center inside the inner shell.

15. The light-emitting device according to claim 9, wherein the inner shell has a shape that is different from a shape of the seed particle.

16. The light-emitting device according to claim 9, wherein the seed particle has a length between and including 2 nm and 10 nm.

17. The semiconductor structure according to claim 10, wherein the seed particle has an aspect ratio greater than 2.0 and less than or equal to 4.0.

18. The semiconductor structure according to claim 10, wherein the first and second semiconductor materials are different from each other.

* * * * *